(12) United States Patent
Onishi

(10) Patent No.: US 6,623,610 B1
(45) Date of Patent: Sep. 23, 2003

(54) MAGNETRON SPUTTERING TARGET FOR MAGNETIC MATERIALS

(76) Inventor: Shinzo Onishi, 1484 Seagull Dr. Apt 208, Palm Harbor, FL (US) 34685

(*) Notice: Subject to any disclaimer, the term of this patent is extended or adjusted under 35 U.S.C. 154(b) by 0 days.

(21) Appl. No.: 10/090,948

(22) Filed: Mar. 2, 2002

(51) Int. Cl.[7] .............................................. C23C 14/35

(52) U.S. Cl. .............................. 204/298.16; 204/298.09

(58) Field of Search ....................... 204/298.09, 298.16

(56) References Cited

U.S. PATENT DOCUMENTS

| | | | | |
|---|---|---|---|---|
| 4,515,675 A | 5/1985 | Kieser | | 204/298 |
| 5,482,611 A | 1/1996 | Helmer | | 204/298.17 |
| 5,512,150 A | 4/1996 | Bourez | | 204/192.2 |
| 5,597,459 A | * 1/1997 | Altshuler | | 204/192.12 |
| 5,685,959 A | 11/1997 | Bourez | | 204/192.2 |
| 5,865,961 A | 2/1999 | Yokoyama | | 204/192.12 |
| 6,159,351 A | * 12/2000 | J'Afer et al. | | 204/298.19 |
| 6,251,242 B1 | 6/2001 | Fu | | 204/298.19 |

OTHER PUBLICATIONS

Onishi et al, "Chemical Vapor Deposition of Single–Crystalline ZnO Film with Smooth Surface on Intermediately Sputtered ZnO Thin Film on Sapphire", Japanese Journal of Applied Physics. vol. 17. No. 5. May 1978. pp. 773–778.
Onishi et al, "Transparent and Highly Oriented ZnO Films Grown at Low Temperatur by Sputtering With a Modified Sputter Gun", Applied Physics Letters, vol. 38, Mar. 15, 1981, pp. 419–421.

* cited by examiner

Primary Examiner—Steven A. VerSteeg

(57) ABSTRACT

A target for physical-vapor deposition (PVD) and methods for depositing magnetic materials are described Radio frequency (RF) or direct current (DC) power is introduced into the chamber through the target to produce plasma. The planar magnetron system is chosen for its high deposition rates. Since the permanent magnets are behind the target in the traditional system, a magnetic target interferes with the required magnetic fields on the target. To eliminate this problem permanent magnets are arranged on the surface and a magnetic target is used as a part of the magnetic circuit. Strong magnetic fields on the target can now be maintained for high deposition rates. The permanent magnets may be covered by a relatively thin, suitable protective-film or by a film of the same material as the target.

14 Claims, 5 Drawing Sheets

MAGNETRON SPUTTERING TARGET FOR MAGNETIC MATERIALS

BACKGROUND

1. Field of Invention

This invention relates to physical-vapor deposition (PVD) and methods for depositing magnetic materials with planar magnetron sputtering system

2. Sputtering Deposion of Prior Art

Sputtering is a method of physical-vapor deposition (PVD) that involves the removal of material from a solid cathode by bombarding it with positive ions from the discharge of a rare gas such as argon (Ar). The cathode can be made of a metal or an insulator and in contrast to thermal evaporation, complex compounds such as high-temperature superconductor (HTS) materials can be sputtered with less chemical-composition change. Sputtering is often done in the presence of a reactive gas, such as oxygen or nitrogen, to control or modify the properties of the deposited film. The following are some of the advantages of the sputtering method:

- Environmentally benign process systems compared with chemical processes
- Choice of a wide range of deposition rates for the best growth conditions
- Control of a wide range of oxygen or nitrogen levels in the dielectric films
- Use of oxide or non-oxide targets (reactive sputtering deposition)
- Use of single or multi co-sputtering processes
- Growth of c-axis oriented layers on amorphous substrates
- Growth of not only c-axis but also a-axis oriented layers on a single-crystalline substrate The sputtering deposition system provides high-density nucleation, which has not only a c-axis but also an a-axis orientation on single-crystalline substrates. This process is ideal for the first, or nucleation step; however, it fails to make a single crystal because of the difficulty to maintain thermal-equilibrium growth-conditions at higher temperatures necessary to grow a single crystal. This is described in Onishi et al, "Chemical Vapor Deposition of Single-Crystalline ZnO Film with Smooth Surface on Intermediately Sputtered ZnO Thin Film on Sapphire".

BACKGROUND OF THE INVENTION

The planar magnetron system is simple and provides high deposition rates from a simple flat target. The conventional system has permanent magnets behind the target that provide strong magnetic fields on the target. The magnetic fields confine high-density plasma to the target. The plasma on the target enhances the deposition rate dramatically. If it is a magnetic target, however, magnetic properties bypass the magnetic fields. Hence magnetic fields on the target will be greatly reduced. Magnetic materials cannot be deposited effectively with a conventional planar magnetron system.

Magnetron systems are very good for Physical Vapor Deposition (PVD) systems as a material source to be deposited because deposition rates are high and excess electron bombardment of the substrate is reduced. This is described in Onishi et al, "Transparent and Highly Oriented ZnO Films Grown at Low Temperature by Sputtering With a Modified Sputter Gun". The planar magnetron generates magnetic fields through the target. The strong magnetic field on the target confines the high density plasma causing target erosion. The conventional target will become thinner as erosion advances and magnetic fields on the eroded areas become stronger. The erosion profiles become deeper narrow rings. The stronger magnetic field accelerates erosion. It creates a narrow, deeper channel. This effect leads to a shorter target life and affects the uniformity of the deposited film on the substrate. The target utilization rate is also lower. To partially solve this problem, costly rotating magnets are required. The rotating magnets act as a magnetic break. This requires a significantly high power motor and excess heat generated on the target becomes a problem.

SUMMARY OF THE INVENTION

1. The new magnetron-sputtering target has the magnets on the substrate-facing surface of the magnetic target rather than behind the target so that strong magnetic fields can be applied to the target surface with smaller magnets.
2. Magnets to be exposed in the plasma may be coated with proper magnetic and/or non-magnetic materials by plating them on the magnet surfaces. This practice is already in use with the conventional magnetron systems to prevent corrosion.
3. The required magnets are very small and provide stronger magnetic flux on the target. Magnetic circuits can be designed more precisely for these frontmounted magnets than for those on the back of the target.
4. Better magnetic circuit design eliminates the need for rotated magnetic fields and provides a more uniform deposit.

The permanent magnets will be placed on the magnetic target rather than behind the target. The major erosion area is between the opposite polarities permanent magnets that are on the magnetic target. The permanent magnets erode very little, but they may be coated with suitable materials to prevent cross contamination. In this configuration, permanent magnet strips or rings form magnetic fields directly on the target, where as the conventional planar magnetron generates magnetic fields through the target. My innovative magnetic circuit design does not limit the thickness of the target and magnetic distribution is far better than that of the conventional design. The required permanent magnets are smaller and much less expensive.

FIG. 1 shows a typical planar magnetron in a vacuum chamber incorporating this new target design. All permanent magnets have a polarization from top to bottom and the target provides a common base for the magnetic circuits set up by the permanent magnets. Strong magnetic fields between opposite permanent-magnet polarities trap and confine the high-density plasma. This high-density plasma on the target enhances target erosion and as erosion advances, the magnetic fields tend to be weaker. This results in wider erosion profiles. Since the magnetic circuits are directly exposed rather than through the thick target, smaller permanent magnets can be used. The smaller magnets make it possible to achieve more efficient erosion patterns. This leads to a more uniform sputtering source without rotating magnets or magnetic fields. Although the rotating magnetic assembly improves deposition uniformity, the rotation reduces the magnetic field on the target, generates more heat due to magnetic break effect, hinders ideal electrical feeding system, and triggers plasma instability, including abnormal arc discharges.

DRAWINGS

Drawing Figures

Figure 1:
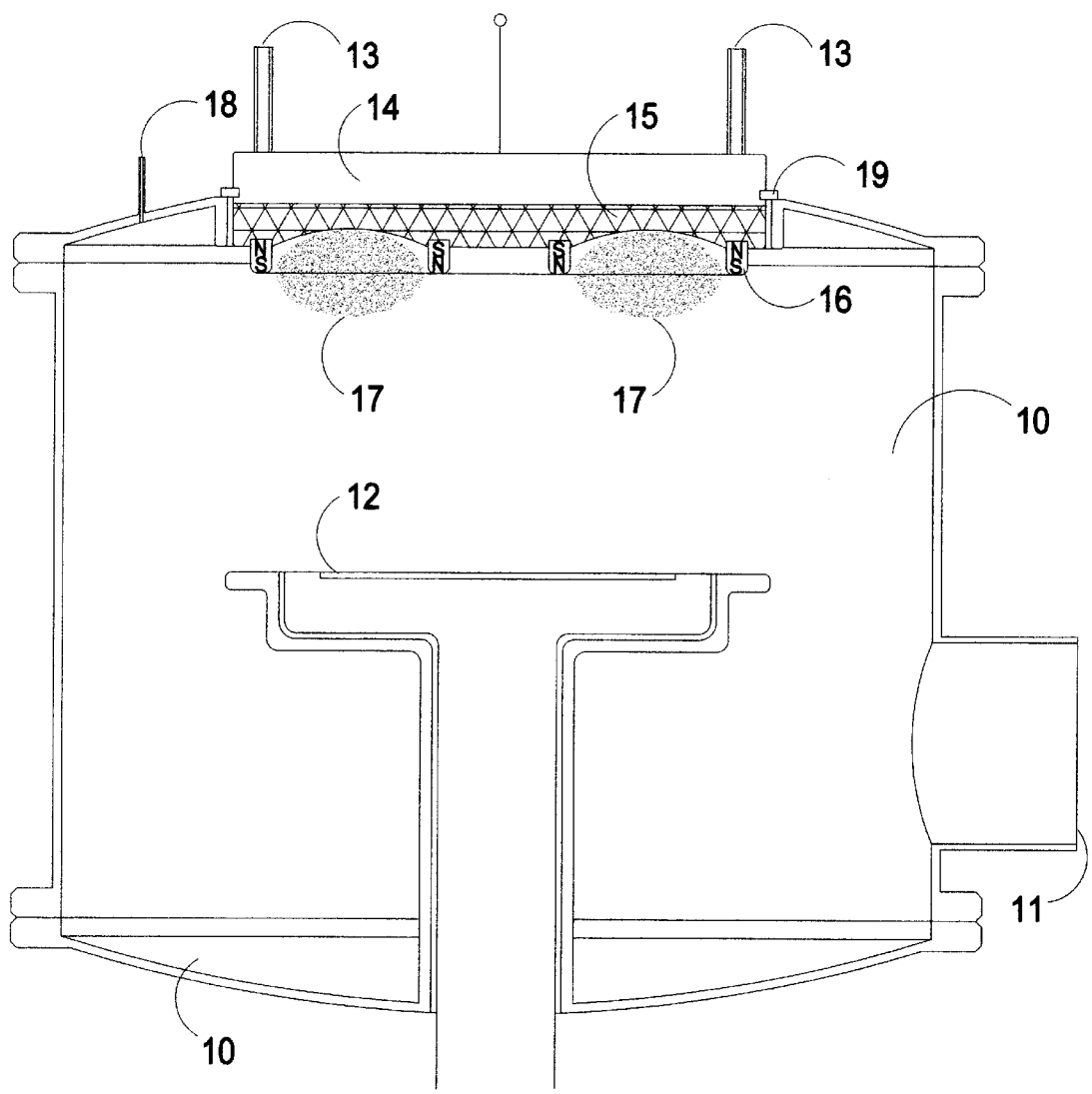
FIG. 1 is a schematic view of a sputtering system having a vacuum chamber 10 within which a target 15, a substrate 12 and a magnet 16 of a magnetron array are set up according to my invention.

In the drawings, closely related figures have the same number but different alphabetic suffixes.

FIG. 1 schematic diagram of sputtering system

Figure 2:
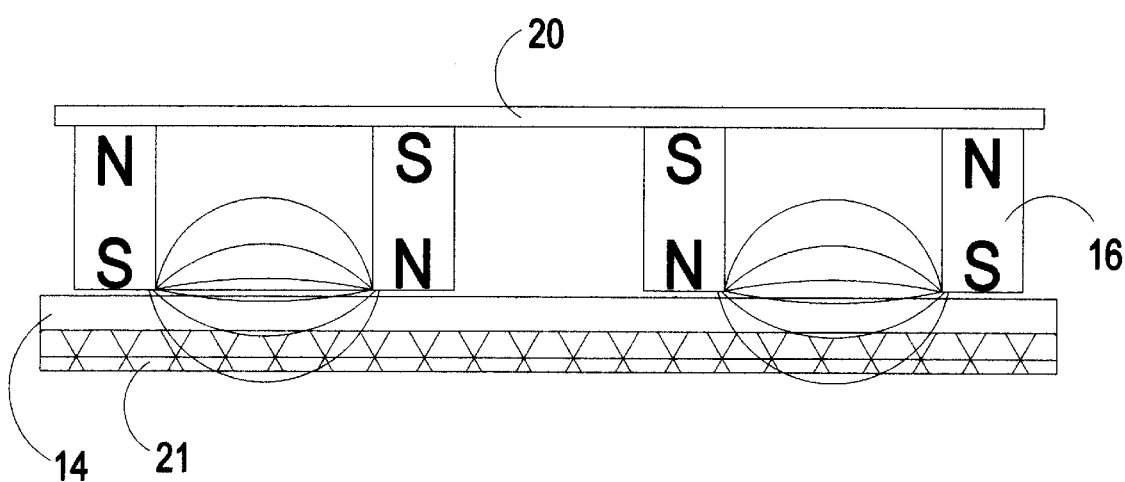

FIG. 2 prior art target assembly

Figure 3:
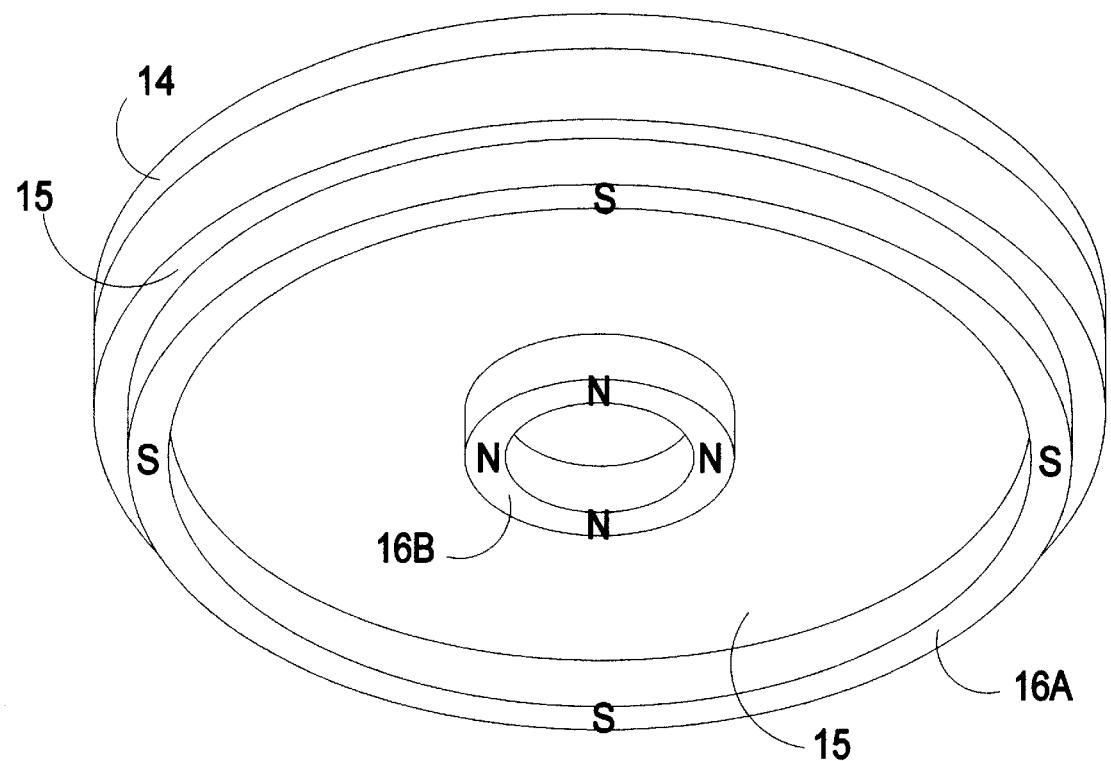

FIG. 3 simple target concept diagram of new invention

Figure 4:
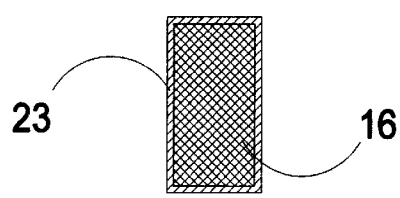

FIG. 4 coated permanent magnet, section

Figure 5:
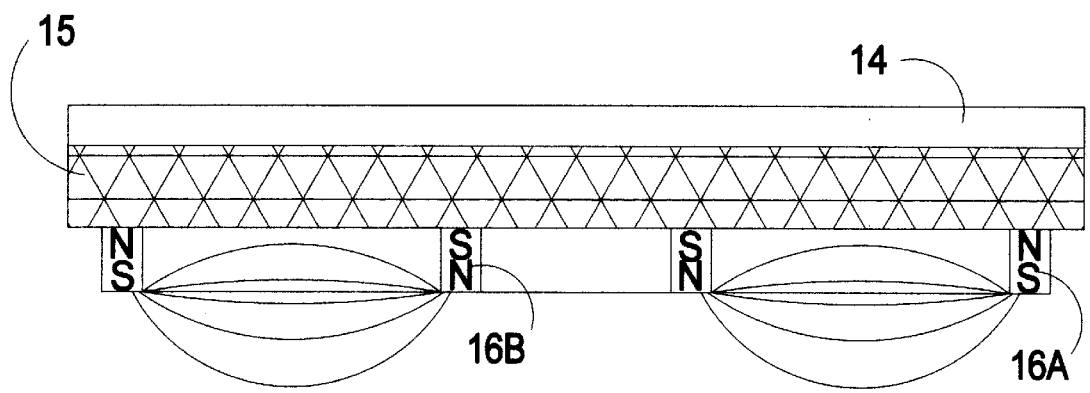

FIG. 5 section diagram of invention, concept 1

Figure 6:
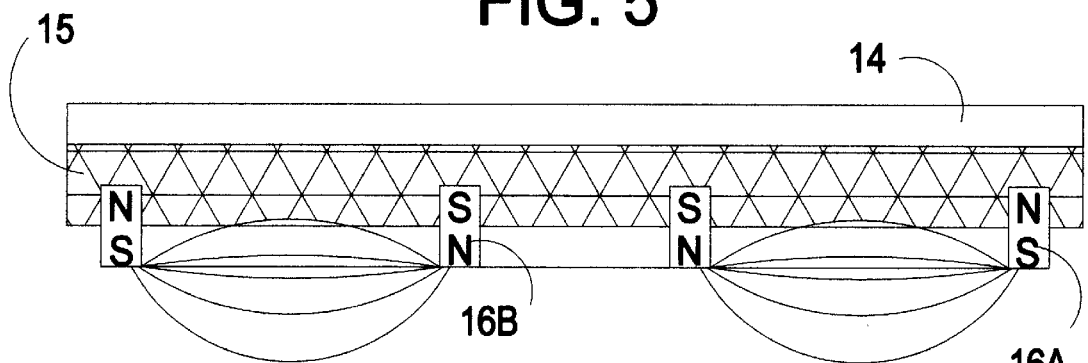

FIG. 6 section diagram of invention, concept 2

Figure 7:
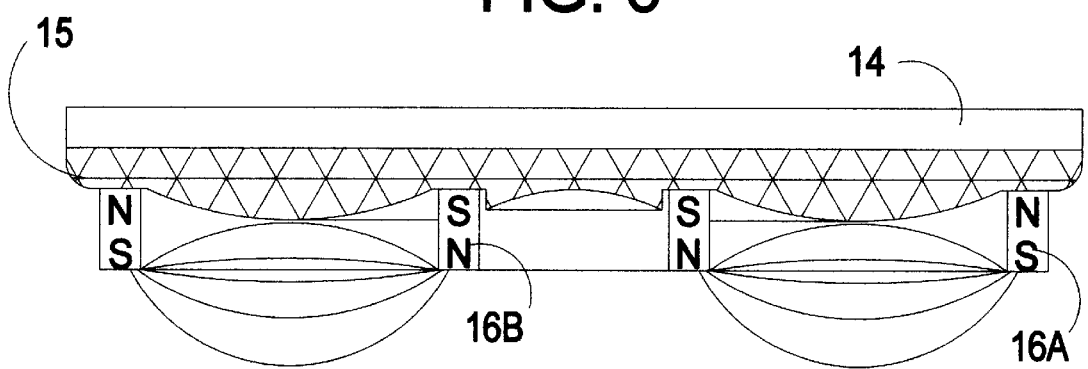

FIG. 7 section diagram of invention, concept 3

Figure 8:
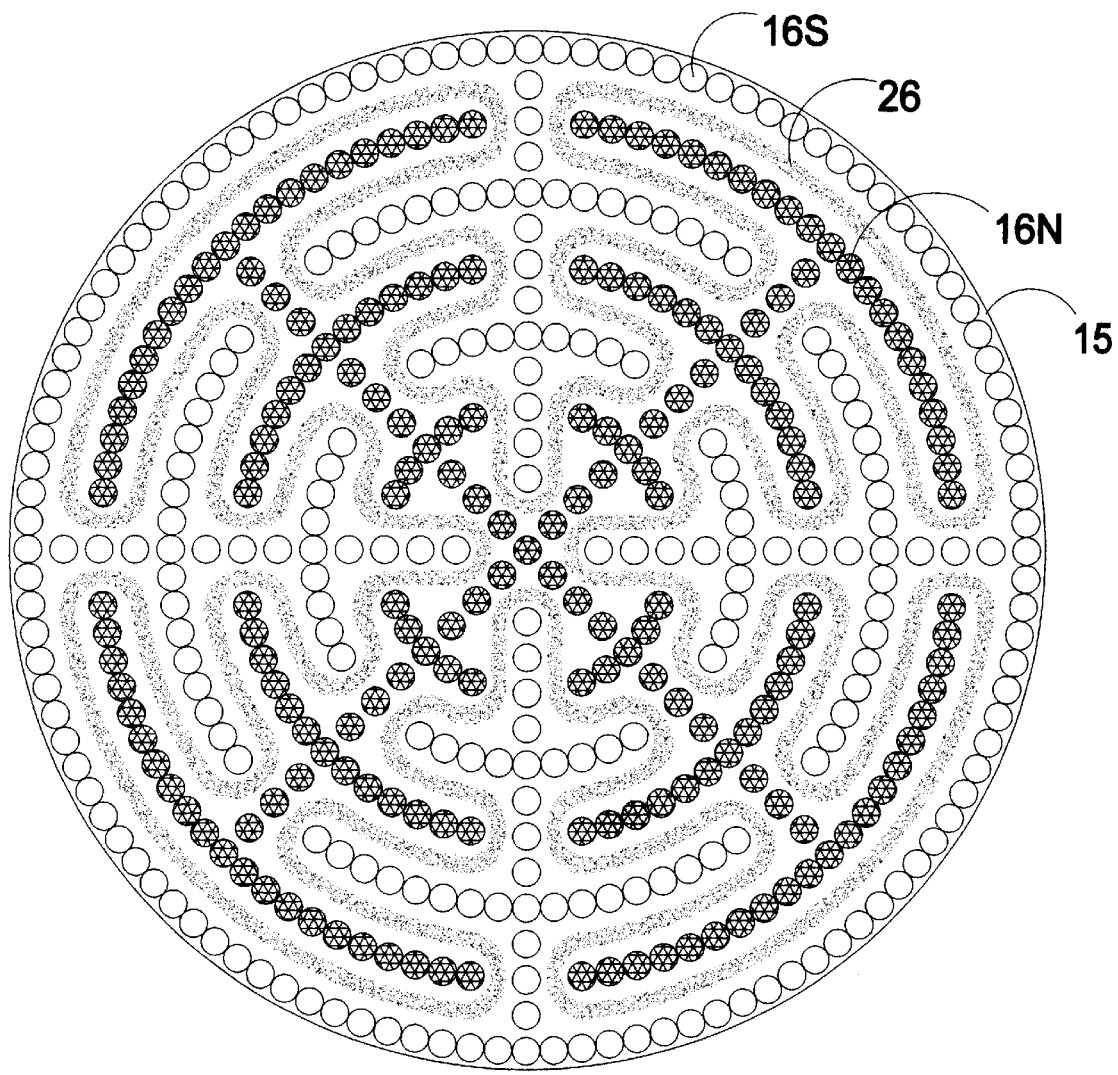

FIG. 8 more realistic magnet arrays, see from substrate side

REFERENCE NUMERALS IN DRAWINGS 10 vacuum chamber
11 to vacuum pump
12 substrate
13 cooling water in-out lets
14 water jacket
15 magnetic target
16 permanent magnet
16A permanent magnet, large ring
16B permanent magnet, small ring
16N permanent magnet, north pole faces substrate
16S permanent magnet, south pole faces substrate
17 plasma
18 gas inlet
19 insulator-vacuum seal
20 magnetic base plate
21 prior art target
23 surface coat
26 major erosion area

DETAILED DESCRIPTION

The sputtering system in which my magnetron array is mounted is shown in FIG. 1. The sputtering process occurs in a vacuum chamber 10 containing a target 15 of material to be sputtered onto a substrate 12 which receives a thin film coating of the material deposited from the target. Sputtering is a method of physical vapor deposition that involves the removal of material from a solid cathode or target 15 by bombarding it with positive ions from the discharge of a rare gas such as argon (Ar) supplied from the gas inlet 18. The cathode can be made of a metal or an insulator and is heated by ion bombardment or discharge energy. The excess heat build-up must be removed by a water jacket 14 with continually circulating water through in/outlet 13. The target assembly is built into the chamber by means of an insulating ring and a vacuum seal 19. The substrate 12 is often a wafer on which magnetic components are fabricated, but it can also be a microelectronic wafer, optical element or other structure having a surface to be coated.

The conventional planar magnetron sputtering assembly is shown in FIG. 2 (PRIOR ART). The magnetic field is provided by permanent magnets 16 mounted on the magnetic base plate 20 behind the target. The field on the target confines the high-density plasma 17. The plasma on the target enhances the deposition rate dramatically. If it is a magnetic target, magnetic properties bypass magnetic fields. Magnetic materials cannot be deposited effectively with a conventional planar magnetron system My invention involves the location of the magnetic array, the preferred configuration of which is shown in FIG. 3. The target portion of the sputtering system consists of an array of permanent magnets fastened to the target surface facing the substrates at an appropriate distance from the substrates.

The magnet 16A and 16B to be exposed in the plasma may be coated with suitable magnetic and/or non-magnetic materials 23 by plating these materials on the magnets as shown in FIG. 4. This practice is already used in the conventional magnetron system to prevent corrosion.

Three variations of target assemblies are shown in FIG. 5, FIG. 6 and FIG. 7. The simplest application of all is that of magnets attached to the magnetic target by their own magnetic forces as shown in FIG. 5. Other attachment methods may be used, including bonding by a suitable material, a mechanical means or any combination of methods to attach the magnets to the target. The back of the target is bonded to a water jacket 14 for cooling purposes. FIG. 6 shows the magnets partially embedded in a magnetic target. Non-magnetic materials may be sputtered by fastening the target to a magnetic base plate. The surface of the target may be modified according to magnetic properties of the target 15, permanent magnets, gas composition and pressure, operating power, and the spacing between the north 16B and south 16A magnets mounted on the surface of the target. The actual surface may be machined to permit a variety of applications. In addition, target size may include very small sizes and the target may be laminated on a magnetic backing plate. FIG. 7 shows a magnetic target with a machined surface, which, when exposed to the plasma, enhances the thin film uniformly as the target erodes more uniformly leading to longer target life.

Using a micro-pattered magnetic circuit as shown in FIG. 8 will maximize performance of the new target assembly. The small magnets are embedded or in the guiding trenches and form micro-patterns of magnetic field between north 16N and south 16S poles on the magnetic target 15. The plasma is confined in the magnetic field and micro-erosion patterns 26 will be formed. The erosion patterns are uniformly distributed so that material supply will be uniform. The substrate can be closer to the target. Multiple benefits include high deposition rate, minimum chamber contamination, and better deposition uniformity. The semi-direct exposure of the permanent magnets provides the best uniformity of magnetic field over the whole target area.

I claim:

1. A magnetron sputtering system comprising permanent magnets fastened to the magnetic target surface facing the substrates at an appropriate distance from the substrates.

2. The system of claim 1, wherein the magnets are coated with suitable materials such as the target material or a non-contaminating material with respect to the deposited film.

3. The system of claim 1, wherein the permanent magnets are directly exposed to the plasma rather than through the target.

4. The system of claim 1, wherein the magnets are small in size relative to the target to allow for desired erosion patterns.

5. The system of claim 1, wherein the magnets are placed so that the erosion profile is widened, thus prolonging the life of the target.

6. The system of claim 1, wherein the permanent magnets are held on the target by their own magnetic force, by a suitable bonding material, mechanically or by a combination of methods.

7. The system of claim 1, wherein the thickness of the target is not limited.

8. The system of claim 1, wherein the surface of the target is a machined surface that may be used for a variety of applications.

9. The system of claim 1, wherein the magnets are arrayed to accommodate very small targets.

10. The system of claim 1, wherein the target is laminated to a magnetic backing plate.

11. The system of claim 1, further wherein there is no limitation on the thickness of the target assembly and further comprising a water jacket wherein the thickness of the water jacket does not hinder the magnetic field strength on the target.

12. The system of claim 1, wherein there are no rotating magnets, and the magnets provide a stable plasma with no abnormal arc discharge, and deposition uniformity.

13. The system of claim 1, wherein there is no high power motor to cause target heating.

14. The system of claim 1, wherein the magnets provide uniform magnetic flux over the entire erosion area.

* * * * *